United States Patent [19]

Kawamura

[11] Patent Number: 5,526,304

[45] Date of Patent: Jun. 11, 1996

[54] SEMICONDUCTOR MEMORY DEVICE INCLUDING THIN-FILM LOAD TRANSISTORS

[75] Inventor: Akio Kawamura, Nara, Japan

[73] Assignee: Sharp Kabushiki Kaisha, Osaka, Japan

[21] Appl. No.: 333,293

[22] Filed: Nov. 1, 1994

[30] Foreign Application Priority Data

Dec. 24, 1993 [JP] Japan .................................. 5-328888

[51] Int. Cl.$^6$ .................................... H01L 29/78
[52] U.S. Cl. .......................... 365/154; 257/369; 257/351; 257/903
[58] Field of Search .......................... 365/154; 257/69, 257/369, 903, 351, 338, 336

[56] References Cited

U.S. PATENT DOCUMENTS

| | | | |
|---|---|---|---|
| 4,814,841 | 3/1989 | Masuoka et al. | 257/69 |
| 5,173,754 | 12/1992 | Manning | 257/69 |
| 5,331,170 | 7/1994 | Hayashi | 257/903 |
| 5,382,807 | 1/1995 | Tsutsumi et al. | 257/336 |

OTHER PUBLICATIONS

IDEM 1990 Technical Digest, "A Polysilicon Transistor Technology for Large Capacity SRAMs", S. Ikeda et al, pp. 469–472.

Primary Examiner—David C. Nelms
Assistant Examiner—Vũ A. Lê
Attorney, Agent, or Firm—Nixon & Vanderhye

[57] ABSTRACT

A semiconductor device which comprises plural memory cells, said memory cell comprising: a flip-flop circuit including a pair of drive transistors each having a gate, a gate oxide film and source/drain regions, and a pair of load TFTs connected to said pair of drive transistors, each of said load TFTs having a gate electrode, a gate oxide film and an active layer including source/drain regions all of which are deposited sequentially in that order; and a pair of access transistors connected to said flip-flop circuit; wherein either one of the source/drain regions of said each TFT is connected to at least either one drive transistor at either one of the source/drain regions thereof or the other drive transistor at the gate thereof via a semiconductor pad, and the other of the source/drain regions of the TFT is connected to a wiring layer via a semiconductor pad; and at least surface layer of said semiconductor pad has the same conductivity type as that of the source/drain regions of the TFT.

5 Claims, 10 Drawing Sheets

SEMICONDUCTOR MEMORY DEVICE INCLUDING THIN-FILM LOAD TRANSISTORS

BACKGROUND OF THE INVENTION

1. Field of the Invention

The present invention relates to a semiconductor device and a process for producing the same and, more particularly, to a semiconductor device comprising an SRAM cell having TFTs as load transistors, and a process for producing the same.

2. Description of the Prior Art

A conventional SRAM cell having thin film transistors (TFTs) as PMOS load transistors will be hereinafter described. FIG. 11 shows an equivalent circuit of the SRAM cell having PMOS load transistors. The SRAM cell comprises a flip-flop circuit and access transistors ATr1 and ATr2. The flip-flop circuit includes drive transistors DTr1 and DTr2 formed on a semiconductor substrate and MOS load TFTs TFT1 and TFT2 stacked on the drive transistors DTr1 and DTr2 for receiving power supply at the nodes thereof. The access transistors ATr1 and ATr2 are connected by nodes thereof to corresponding bit lines BL, respectively. Such construction as having the MOS load thin film transistors TFT1 and TFT2 stacked on the respective drive transistors DTr1 and DTr2 on the semiconductor substrate makes it possible to reduce the size of each SRAM cell and hence to increase the memory capacity of the whole SRAM.

With reference to FIGS. 24 to 32, a conventional process for producing a TFT in the aforesaid SRAM will be described below.

A field isolation film 71 is formed on a silicon substrate 70 for device isolation. Then, drive MOS transistors DTr1 and DTr2 are formed on the silicon substrate 70 in a known manner. An interlayer insulation film 72 is formed over the entire surface of the silicon substrate 70, and then a contact hole 72a is formed in the interlayer insulating film 72 above a desired region, i.e., above a region where a gate electrode 73 of the drive transistor DTr2 and a source/drain region 74 of the drive transistor DTr1 are formed, as shown in FIG. 24.

In turn, as shown in FIG. 25, a polysilicon film is deposited over the entire surface of the silicon substrate 70 including the contact hole 72a, and then patterned into a desired configuration to form a gate electrode 75a of a TFT and polysilicon pads 75b and 75c which serve as semiconductor pads for the wiring of the TFT. The polysilicon film has a thickness of about 100 nm to about 200 nm, and is doped with such an N-type impurity as phosphorus or arsenic ions in a high concentration of about $10^{20}$ cm$^{-3}$ or more. The doping of the polysilicon film with the N-type impurity may be achieved by ion-implanting or diffusing the impurity into polysilicon which has been deposited on the substrate by way of low pressure CVD, or by depositing doped silicon on the substrate using phosphine ($PH_3$) gas and silane ($SiH_4$) gas. The provision of the polysilicon pad 75b enables the gate electrode 73 of the drive transistor DTr2 to be connected to the source/drain region 74 of the drive transistor DTr1 and at the same time to either of source/drain regions of the TFT 1 which are to be formed in a later process, at a connection point A shown in FIG. 11. Though the TFT 1 and the drive transistors DTr1 and DTr2 are connected at the same time in this case, the contact hole 72a may be formed only on the gate electrode 73 of the drive transistor DTr2 or only on the source/drain region 74 of the drive transistor DTr1. In such a case, however, the gate electrode 73 of the drive transistor DTr2 and the source/drain region 74 of the drive transistor DTr1 should be connected by any means other than the contact hole 72a.

Subsequently, as shown in FIG. 26, an $SiO_2$ film with a thickness of about 10 nm to about 50 nm is deposited on the entire surface of the silicon substrate 70 including the gate electrode 75a of the TFT and polysilicon pads 75b and 75c by way of CVD to form a gate oxide film 76 of the TFT.

Then, as shown in FIG. 27, openings 76a are formed in the gate oxide film 76 above the polysilicon pads 75b and 75c by photolithography and RIE process.

In turn, as shown in FIG. 28, a polysilicon film with a thickness of about 10 nm to about 100 nm is deposited on the entire surface of the silicon substrate 70 including the openings 76a by way of low pressure CVD, and then patterned into a desired configuration to form an active layer 77 for a channel and the source/drain regions of the TFT. The active layer 77 is connected to the polysilicon pads 75b and 75c via the openings 76a formed in the gate oxide film 76. The polysilicon film may otherwise be formed by depositing an amorphous silicon thin film by way of low pressure CVD and then annealing the thin film at a temperature of about 600° C. for re-crystallization. Further, the polysilicon film may be doped with such an impurity as phosphorus or arsenic in a low dose of about $10^{12}$ cm$^{-2}$ to about $10^{13}$ cm$^{-2}$ by ion-implantation to adjust the threshold voltage of the TFT.

Next, as shown in FIG. 29, a resist is applied on the entire surface of the silicon substrate 70, and then patterned into a desired configuration by photolithography process to form a resist pattern 78. Using the resist pattern 78 as a mask, boron or $BF_2$ ions are implanted into the active layer 77 in a high dose of about $10^{14}$ cm$^{-2}$ to about $10^{15}$ cm$^{-2}$ to form the source/drain regions 77c and 77a of the TFT. A portion of the active layer 77 covered with the resist pattern 78 is not doped with the P-type impurity, thus forming the channel 77b of the TFT.

After the resist pattern 78 is removed, a CVD oxide film 79 with a thickness of about 400 nm to about 1000 nm is deposited on the entire surface of the substrate to form an interlayer insulation film, as shown in FIG. 30.

Then, as shown in FIG. 31, an opening 79a is formed in the CVD oxide film 79 above the polysilicon pad 75c by photolithography and RIE process.

In turn, as shown in FIG. 32, the opening 79a is refilled with a metal such as Al, Cu, Ti or W, or an alloy or silicide thereof which is patterned to form a wiring 80. The wiring 80 is connected to the polysilicon pad 75c through the opening 79a formed in the CVD oxide film 79.

An interlayer film, through-holes, a second metal wiring layer and a protection film, if necessary, are formed in a known manner to complete the SRAM cell (not shown) having TFTs as PMOS load transistors.

In the SRAM cell fabricated in accordance with the aforesaid conventional process, the polysilicon pad 75c serves to prevent an adverse effect caused by an over-etching of the CVD oxide film 79 in directly connecting the wiring 80 to the source region 77c. In such a case, the CVD oxide film 79 on the thin active layer 77 has to be removed by etching, and if the selective etching ratio of the oxide film to the active layer made of polysilicon is less than about 10, for example, the active layer 77 may be broken trough by overetching. Therefore, the opening for forming the wiring 80 is formed on the relatively thick polysilicon layer 75c to prevent the breakthrough of the active layer 77. This ensures the connection between the source region 77c of the TFT and the wiring 80, while preventing the wiring 80 from contacting other wiring layers.

However, this fabrication process has such problems as stated below. In the aforesaid SRAM cell, power is supplied to the wiring 80 as a Vcc line, the polysilicon pad 75c highly doped with the N-type impurity, and the source region 77c of the TFT highly doped with the P-type impurity in the order. In other words, power is supplied in the reverse direction of a polysilicon PN junction. In general, when power is supplied in the reverse direction of the polysilicon PN junction, the rectification characteristic of the TFT becomes low. However, the low rectification characteristic was not conventionally recognized as a problem because of a relatively large junction leak current due to a low crystallization of polysilicon. In recent years, improved crystallization of polysilicon has now recognized that the major problem in the power supply to the memory cell is caused by the low rectification characteristic of the TFT. If the power supply to the memory cell is insufficient, a current supply to a storage node such as formed at a point A or B shown in FIG. 11 becomes insufficient, thereby deteriorating a stable data retention. This may result in such a serious problem as the missing of memory.

Further, a PN junction is also formed at the juncture of the drain region 77a of the TFT and the polysilicon pad 75b in the memory cell region. Since this PN junction is a forward direction junction unlike the aforesaid power supply section, there is no fear of insufficient power supply. However, the forward direction current supply requires a voltage of not less than about 1 V, because a built-in potential observed at the PN junction is about 0.9 eV or more. That is, at the early stage of the current supply with the TFT being turned on, the potential applied to the PN junction is lower than the built-in potential, hence the current supply to the storage node is restricted. Even after a sufficient time has elapsed since the TFT was turned on, the potential of the storage node is reduced by the built-in potential, and cannot be raised up to the power supply potential. This reduces the amount of electric charge stored in the storage node. Accordingly, such problems as deterioration of data retention capability and read-out errors may occur.

One approach to avoid the formation of the PN junction between the polysilicon pad 75c and the source region 77c made of polysilicon is that the polysilicon pad 75c and the source region 77c are formed of a polysilicon doped with an impurity of the same conductivity type, for example, P-type impurities such as boron is diffused into the polysilicon. In this case, however, the polysilicon pad 75b is directly connected to the N-type source/drain region 74 of the drive transistor DTr1 at the connection point of the TFT and the drive transistors DTr1 and DTr2, i.e., at the connection point between the drain region 77a and polysilicon pad 75b. That is, the P-type impurity diffuses from the polysilicon pad 75b into the N-type source/drain region 74 of the drive transistor DTr1. This will bring about such problems as an increased resistance of the source/drain region 74 of the drive transistor DTr1, a variation in the threshold voltage due to the diffusion of the P-type impurity to the channel section.

S. Ikeda et al reported a semiconductor device comprising a TFT-type SRAM which can avoid parasitic rectification characteristic of a PN junction formed by connecting a p$^+$ source/drain region of a PMOS load TFT to an n$^+$ wiring layer formed thereunder (see Technical Digest,IEDM, 1990, pp.469–472). In accordance with a production process described in this literature, however, the PN junction is formed at a reduced temperature (more specifically, at a temperature below the melting point of a BPSG employed as an insulation film) during the production steps after the formation of the TFT. Accordingly, the surface of the insulation film is not sufficiently planarized, and this may result in the breakage of a wiring layer.

SUMMARY OF THE INVENTION

It is an object of the present invention to provide a semiconductor device comprising SRAM cells having TFTs as load transistors in which wiring is connected to the TFTs in a good condition to improve the device characteristics, and a process for producing the same.

According to a first aspect of the present invention, there is provided a semiconductor device which comprises plural memory cells, said memory cell comprising: a flip-flop circuit including a pair of drive transistors each having a gate electrode, a gate oxide film and source/drain regions, and a pair of load TFTs connected to said pair of drive transistors, each of said load TFTs having a gate electrode, a gate oxide film and an active layer including source/drain regions all of which are deposited sequentially in that order; and a pair of access transistors connected to said flip-flop circuit; wherein either one of the source/drain regions of said each TFT is connected to at least either one drive transistor at either one of the source/drain regions thereof or the other drive transistor at the gate electrode thereof via a semiconductor pad, and the other of the source/drain regions of the TFT is connected to a wiring layer via a semiconductor pad; and at least surface layer of said semiconductor pad has the same conductivity type as that of the source/drain regions of the TFT.

According to a second aspect of the present invention, there is provided a semiconductor device which comprises plural memory cells, said memory cell comprising: a flip-flop circuit including a pair of drive transistors each having a gate electrode, a gate oxide film and source/drain regions, and a pair of load TFTs connected to said pair of drive transistors, each of said load TFTs having a gate electrode, a gate oxide film and an active layer including source/drain regions all of which are deposited sequentially in that order; and a pair of access transistors connected to said flip-flop circuit; wherein either one of the source/drain regions of said each TFT is connected via an electrically conductive film for preventing impurity diffusion to a semiconductor pad and to at least either one drive transistor at either one of the source/drain regions thereof or the other drive transistor at the gate thereof, and the other of the source/drain regions of the TFT is connected to a wiring layer via an electrically conductive film for preventing impurity diffusion and a semiconductor pad.

According to a third aspect of the present invention, there is provided a process for producing a semiconductor device, comprising the steps of: (i) forming drive transistors on a semiconductor substrate and an interlayer insulation film covering said drive transistors, followed by forming a contact hole in a desired region of said interlayer insulation film to provide connection to said drive transistors; (ii) depositing a semiconductor film on the entire surface of the semiconductor substrate including said contact hole, and patterning said semiconductor film into a desired configuration to form a gate electrode of a TFT and semiconductor pads; (iii) forming a gate oxide film on said gate electrode and said semiconductor pads and openings in said gate oxide film on said semiconductor pads, and then depositing polysilicon on the entire surface of the semiconductor substrate including said openings, followed by patterning said polysilicon to form an active layer of the TFT having connections to said semiconductor pads; (iv) performing ion-implantation at a portion of said active layer on said gate electrode of the TFT being masked with a resist pattern to form source/drain regions of the TFT in said active layer; and (v) further performing implantation of ions of the same conductivity type as that used in the former ion-implantation with use of said resist pattern as a mask at an implantation energy higher than that employed for the former ion-implantation to form an impurity layer of the same conductivity type as that of the source/drain regions of the TFT in at least surface layers of the semiconductor pads.

According to a fourth aspect of the present invention, there is provided a process for producing a semiconductor device, comprising the steps of: (i) forming drive transistor on a semiconductor substrate and an interlayer insulation film covering said drive transistors, followed by forming a contact hole in a desired region of said interlayer insulation film to provide connection to said drive transistors; (ii) depositing a semiconductor film on the entire surface of the semiconductor substrate including said contact hole, and patterning said semiconductor film into a desired configuration to form a gate electrode of a TFT and semiconductor pads; (iii) forming a gate oxide film on said gate electrode and said semiconductor pads and forming a resist pattern in a desired configuration by photolithography process, followed by forming openings in said gate oxide film on said semiconductor pads with use of the resist pattern as a mask; (iv) forming an electrically conductive film on the entire surface of the semiconductor substrate including said resist pattern and openings, thereafter removing said resist pattern by etching so that said electrically conductive film remains only in said openings formed in the gate oxide film, followed by annealing said electrically conductive film in a nitrogen atmosphere to turn said electrically conductive film into an electrically conductive nitride film; (v) depositing polysilicon on the entire surface of the gate oxide film including said electrically conductive nitride film, followed by patterning said polysilicon into a desired configuration to form an active layer of the TFT having connections to said semiconductor pads via said electrically conductive film; and (vi) performing ion-implantation at a portion of said active layer on said gate electrode being masked with a resist pattern to form source/drain regions of the TFT in said active layer.

DETAILED DESCRIPTION OF THE PREFERRED EMBODIMENTS

Figure 1:
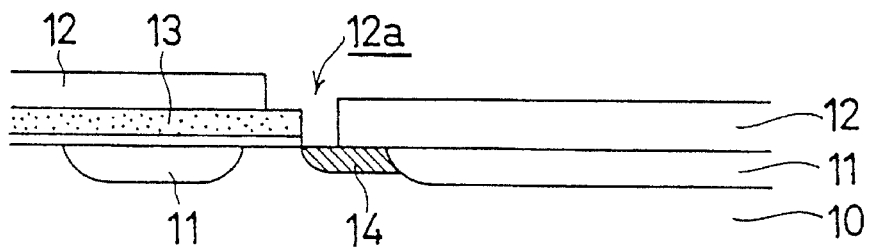
FIGS. 1 to 10 are diagrams illustrating a production process of a semiconductor device according to a first embodiment of the present invention.

A semiconductor device according to the present invention which comprises plural memory cells, the memory cell includes a flip-flop circuit having a pair of drive transistors and a pair of MOS load TFTs, and a pair of access transistors. The memory cell of such configuration is formed on a semiconductor substrate. The semiconductor substrate is preferably a silicon substrate, but not particularly limited thereto. The drive transistors are first formed on the semiconductor substrate in a known manner, and then the TFTs are stacked on the drive transistors with an interlayer insulation film being interposed therebetween.

The interlayer insulation film on the drive transistors is preferably formed of $SiO_2$, but not particularly limited thereto. The thickness of the interlayer insulation film is preferably between about 50 nm and about 200 nm. The interlayer insulation film can be formed in a known manner.

The TFTs of the semiconductor device of the present invention each comprise a gate electrode, a gate oxide film and an active layer including source/drain regions. Either one of the source/drain regions of each TFT is connected to a power supply, and the other of the source/drain regions of the TFT is connected to at least either one drive transistor at a source/drain region thereof or to the other drive transistor at a gate electrode thereof, typically, via semiconductor pads. The semiconductor pads can be formed of the same material as that of the gate electrode of the TFT simultaneously with the formation of the gate electrode. For example, the semiconductor pads are formed of a polysilicon film with a thickness of about 100 nm to about 200 nm when the gate electrode is formed in a known manner such as CVD. The semiconductor pads are preferably doped with an N-type impurity such as phosphorus or arsenic in a high concentration of about $10^{20}$ $cm^{-3}$ or greater. The doping of the polysilicon film with the N-type impurity is achieved, for example, by ion-implanting or diffusing the impurity into polysilicon which has been deposited on the substrate by CVD process or, alternatively, by depositing doped silicon on the substrate using phosphine ($PH_3$) gas and silane ($SiH_4$) gas, but the doping method is not particularly limited thereto. After the formation of the gate electrode of the TFT and the semiconductor pads, a gate oxide film of $SiO_2$ or the like is formed in a known manner. The thickness of the gate oxide film is preferably between about 10 nm and about 50 nm. To connect the TFT to the power supply and to the drive transistor, openings are formed in the gate oxide film above the aforesaid semiconductor pads. The openings can be formed in a known manner, for example, by photolithography and RIE process. An active layer of the TFT is preferably formed of a polysilicon film in a known manner. Alternatively, the active layer may be formed by depositing an amorphous silicon thin film through low pressure CVD and then annealing the thin film at a temperature of about 600° C. for re-crystallization. The polysilicon is preferably doped with such an impurity as phosphorus or arsenic in a low dose of about $10^{12}$ $cm^{-2}$ to about $10^{13}$ $cm^{-2}$ through ion-implantation to adjust a threshold voltage of the TFT.

Before a resist mask used to form the aforesaid openings in the gate oxide film is removed, an electrically conductive film for preventing impurity diffusion such as of a titanium film with a thickness of about 20 nm to about 100 nm may be formed on the resist mask. The electrically conductive film for preventing impurity diffusion can be formed only in the openings of the gate oxide film by removing an unnecessary portion of the electrically conductive film for preventing impurity diffusion along with the resist mask. The electrically conductive film for preventing impurity diffusion may be formed in a known manner, for example, by way of sputtering.

After the electrically conductive film for preventing impurity diffusion is formed in the openings of the gate oxide film, the electrically conductive film for preventing impurity diffusion is preferably annealed at a temperature of about 600 °C. to about 750° C. in a nitrogen atmosphere for several minutes to several dozens minutes. Through this annealing, the electrically conductive film for preventing impurity diffusion is turned into a nitride film.

Next, after a resist mask is formed on the active layer above the gate electrode of the TFT in a known manner, for example, through photolithography, P-type impurity ions such as boron ions or $BF_2$ ions are implanted into the active layer in a dose of about $10^{14}$ cm$^{-2}$ to about $10^{15}$ cm$^{-2}$ to form the source/drain regions of the TFT in the active layer. At this time, the implantation energy is between about 10 KeV and about 20 KeV for boron, or between about 30 KeV and about 100 KeV for $BF_2$.

After the source/drain regions of the TFT are thus formed, an impurity of the same conductivity type as that of the source/drain regions of the TFT, i.e., P-type impurity, is further implanted from the surface of the source/drain regions in a dose of about $1\times10^{15}$ cm$^{-2}$ to about $3\times10^{15}$ cm$^{-2}$ using the same mask as that used for the formation of the source/drain regions of the TFT, if the electrically conductive film for preventing impurity diffusion is not formed on the semiconductor pads. At this time, the implantation energy is greater than that employed for the formation of the source/drain regions of the TFT, for example, about 30 KeV to about 70 KeV for boron. Accordingly, the surface layers of the semiconductor pads are doped with an impurity of the same conductivity type as that of the source/drain regions and, therefore, PN junctions are formed in the semiconductor pads. Preferably, each semiconductor pad of about 100 nm to about 200 nm thickness has a surface layer of about 50 nm to about 100 nm thickness exhibiting the same conductivity type as that of the source/drain regions of the TFT. If the ion-implantation is carried out again after the formation of the source/drain regions of TFT, the same mask as used for the formation of the source/drain regions of the TFT may be isotropically etched at the edge portion thereof to reduce its dimensions by about 0.2 µm to about 1.0 µm, thereby expanding the window area of the mask. As a result, the source/drain regions are expanded toward the channel of the TFT, and the impurity concentration of the expanded regions is lower than that of the source/drain regions of the TFT. Thus, the source/drain regions can be formed in an LDD structure.

The connection between the TFT and the power source is established through one source/drain region of the TFT and one semiconductor pad. The wiring to the power source is suitably formed of a metal such as Al, Cu, Ti or W, or an alloy or silicide thereof which is typically employed to form a wiring layer, in a known manner, for example, vacuum evaporation.

After the drive transistors and TFTs are thus formed with the connection between the drive transistors and the TFTs and between the TFTs and the power source being established, an interlayer film, through-holes, a second metal wiring layer and a protection film, if necessary, are formed in a known manner to complete the SRAM cell having the TFTs as MOS load transistors. The access transistors may be formed simultaneously with the formation of the drive transistors, or may be formed simultaneously with or before the formation of the TFTs after the formation of the drive transistors.

Having thus been disclosed, the present invention will be detailed by way of the following embodiments.

Example 1

Figure 11:
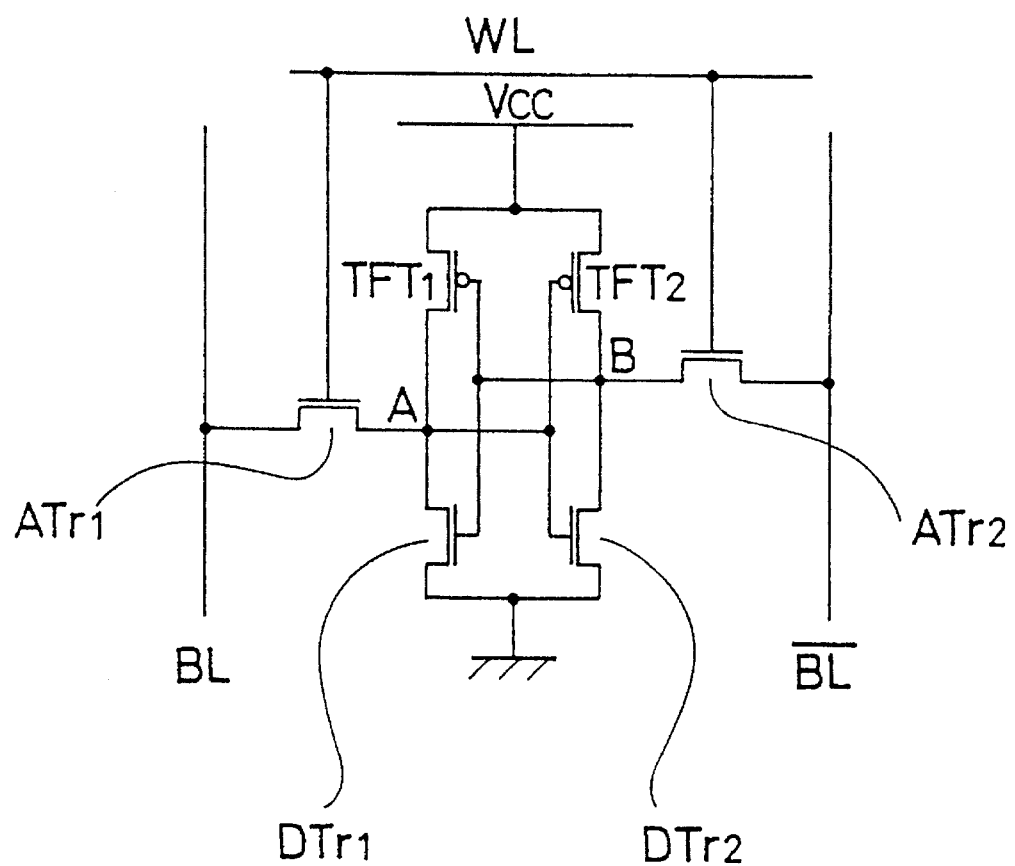
FIG. 11 is a circuit diagram of a semiconductor device of the present invention.

FIG. 11 shows an equivalent circuit of an RAM cell having PMOS load transistors. This RAM cell comprises a flip-flop circuit and access transistors ATr1 and ATr2. The flip-flop circuit includes drive transistors DTr1 and DTr2 formed on a semiconductor substrate and MOS load thin film transistors TFT1 and TFT2 stacked on the drive transistors DTr1 and DTr2 for receiving power supply at the nodes thereof. The access transistors ATr1 and ATr2 are connected by nodes thereof to bit lines BL. Since the MOS load TFTs TFT1 and TFT2 are thus stacked on the drive transistors DTr1 and DTr2 formed on the semiconductor substrate, the SRAM can have memory cells reduced in size and an increased memory capacity.

Description is now made on a production process of a semiconductor device according to a first embodiment of the present invention with reference to FIGS. 1 to 10.

A field isolation film 11 is formed on a silicon substrate 10 for device isolation. Drive MOS transistors (DTr1 and DTr2 shown in FIG. 11) are then formed on the silicon substrate 10 in a known manner. Thereafter, an interlayer insulation film 12 is formed on the entire surface of the silicon substrate 10, and a contact hole 12a is formed in the interlayer film 12 above a desired region, i.e., above a region where a gate electrode 13 of the drive transistor DTr2 and a source/drain region 14 of the drive transistor DTr1 are formed, as shown in FIG. 1.

Figure 2:
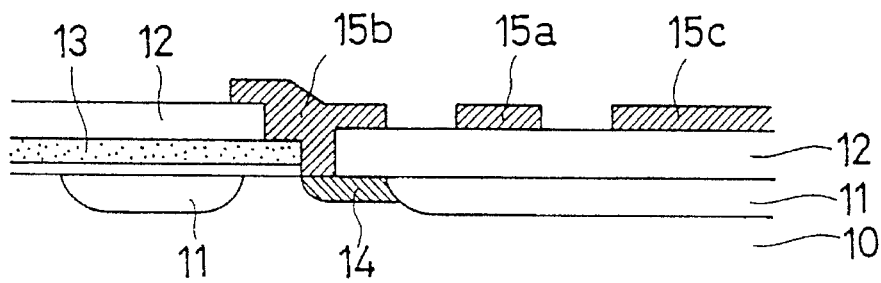

As shown in FIG. 2, a polysilicon film is formed on the entire surface of the silicon substrate 10 including the contact hole 12a, and then patterned into a desired configuration to form a gate electrode 15a of each TFT and polysilicon pads 15b and 15c which serve for the wiring of the TFT. The polysilicon film has a thickness of about 200 nm, and is doped with such an N-type impurity as phosphorus or arsenic in a high concentration of about $10^{20}$ cm$^{-3}$ or more. The gate electrode 13 of the drive transistor DTr2 is connected through the silicon pad 15b to the source/drain region 14 of the drive transistor DTr1 and, at the same time, to either of the source/drain regions of the TFT which are to be formed in a later process, at a connection point A shown in FIG. 11. Though the TFT and the drive transistors DTr1 and DTr2 are connected at the same time in this case, the contact hole 12a may be formed only on the gate electrode 13 of the drive transistor DTr2 or only on the source/drain region 14 of the drive transistor DTr1. In such a case, however, the gate electrode 13 of the drive transistor DTr2 and the source/drain region 14 of the drive transistor DTr1 should be connected by any means other than the contact hole 12a.

Figure 3:
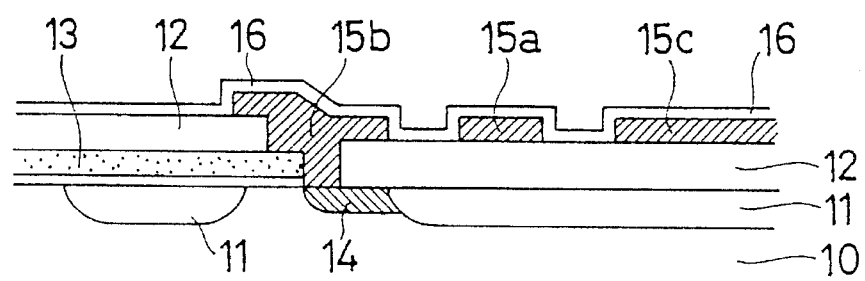

Subsequently, as shown in FIG. 3, an $SiO_2$ film with a thickness of about 50 nm is deposited on the entire surface of the silicon substrate 10 including the gate electrode 15a of the TFT and polysilicon pads 15b and 15c by way of CVD to form a gate oxide film 16 of the TFT.

Figure 4:
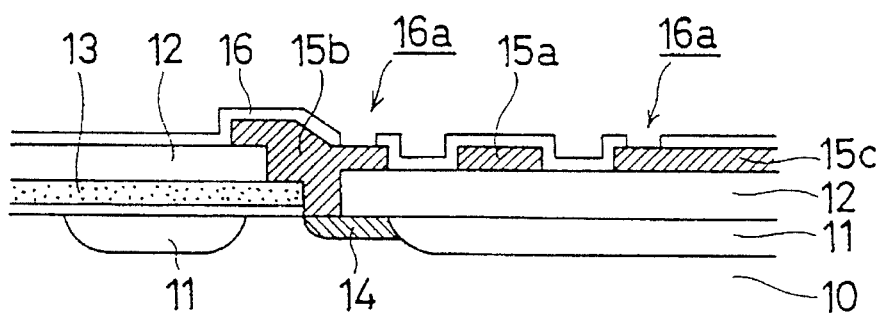

Then, as shown in FIG. 4, openings 16a are formed in the gate oxide film 16 above the polysilicon pads 15b and 15c by photolithography and RIE process.

Figure 5:
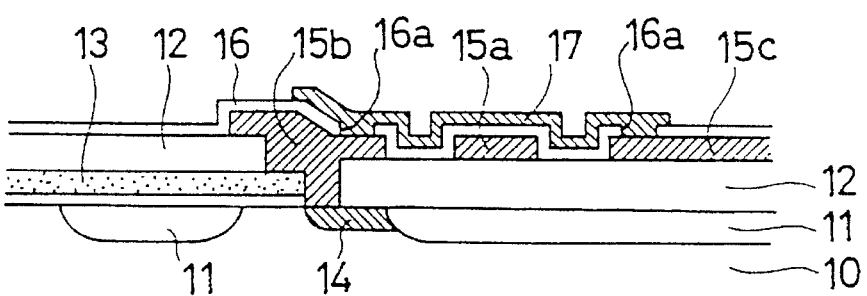

In turn, as shown in FIG. 5, a polysilicon film with a thickness of about 100 nm is deposited on the entire surface of the silicon substrate 10 including the openings 16a by way of low pressure CVD, and patterned into a desired configuration to form an active layer 17 for the channel and source/drain regions of the TFT. The active layer 17 is connected to polysilicon pads 15b and 15c via the openings 16a formed in the gate oxide film 16.

Figure 6:
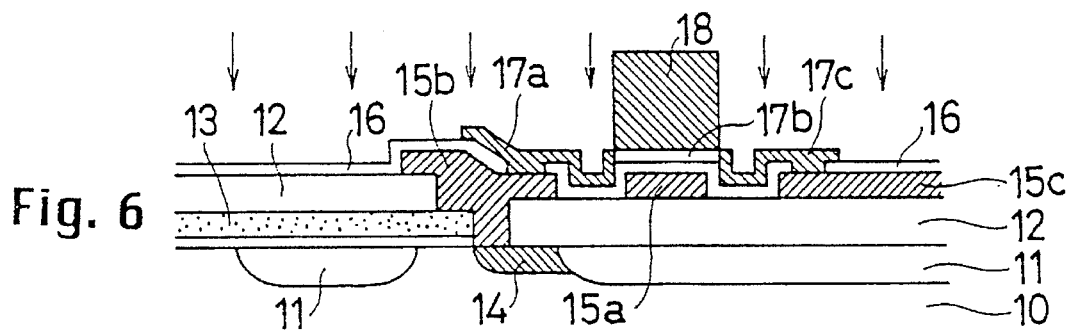

Next, as shown in FIG. 6, a resist is applied on the entire surface of the silicon substrate 10, and then patterned into a desired configuration by photolithography process to form a resist pattern 18. Using the resist pattern 18 as a mask, boron or $BF_2$ ions are implanted into the active layer 17 in a high dose of about $10^{14}$ cm$^{-2}$ to about $10^{15}$ cm$^{-2}$ to form the source/drain regions 17a and 17c of the TFT. At this time, the implantation energy is between 10 KeV and 25 KeV for boron ions, or between 30 KeV and 100 KeV for $BF_2$ ions. A portion of the active layer 17 covered with the resist pattern 18 is not doped with the P-type impurity, thereby defining the channel 17b of the TFT.

Figure 7:
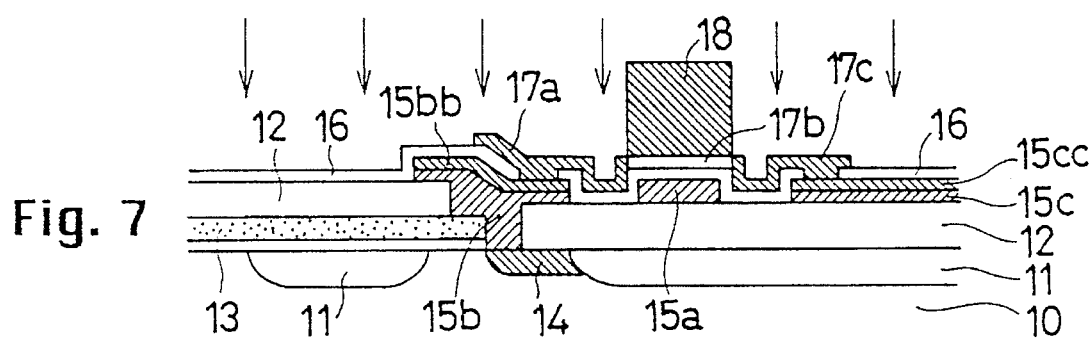

In turn, as shown in FIG. 7, boron or $BF_2$ ions are further implanted using the same resist pattern 18 to the active layer 17 in a high dose of about $1\times10^{15}$ cm$^{-2}$ to about $3\times10^{15}$ cm$^{-2}$ at a high energy. At this time, the implantation energy is typically between about 30 KeV and about 75 KeV for boron ions. In this process, the source/drain regions 17a and 17c of the TFT are formed, while at the same time, regions 15cc and 15bb are formed with the same conductivity type as the source/drain regions 17a and 17b in the surface layers of the polysilicon pads 15c and 15b by the implantation through the source/drain regions 17a and 17c and the gate oxide film 16.

Figure 8:
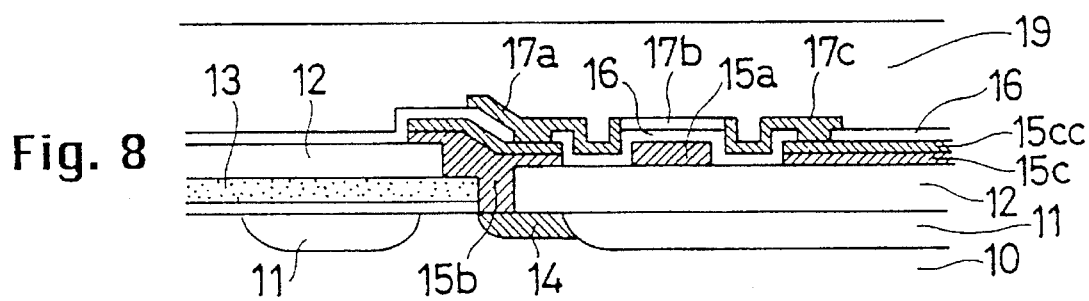

After the resist pattern 18 is removed, a CVD oxide film 19 is deposited on the entire surface of the substrate to form an interlayer insulation film, as shown in FIG. 8. The thickness of the CVD oxide film 19 is, for example, about 600 nm.

Figure 9:
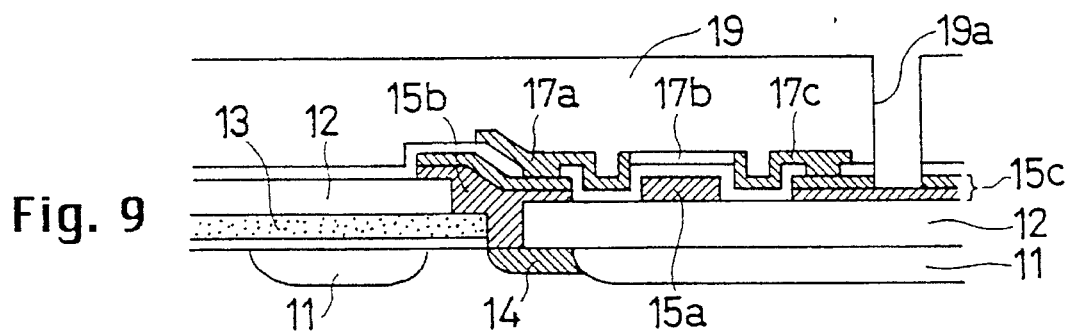

Then, as shown in FIG. 9, an opening 19a is formed in the CVD oxide film 19 above the polysilicon pads 15c by photolithography and RIE process.

Figure 10:
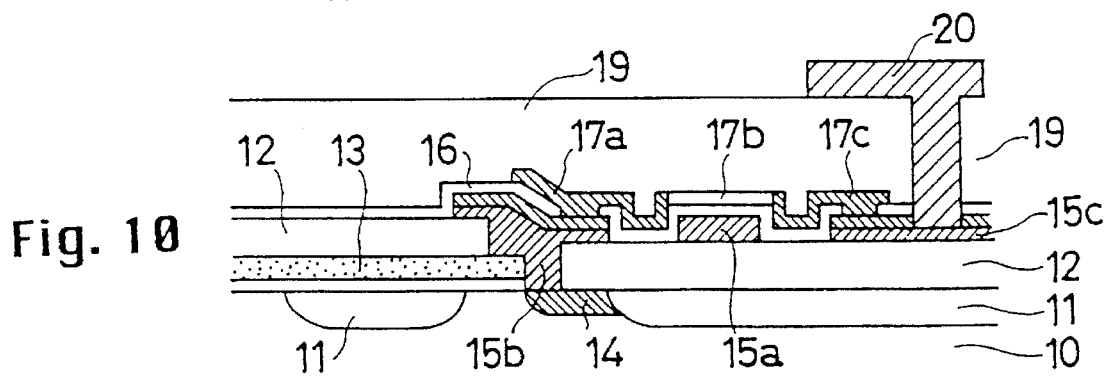

In turn, as shown in FIG. 10, an aluminum wiring 20 is formed in a desired pattern on the CVD oxide film 19 including the opening 19a. This metal wiring 20 is connected to the polysilicon pad 15c in the opening 19a formed in the CVD oxide film 19, and serves as a wiring for power supply. As required, there are formed an interlayer film, through-holes, a second metal wiring layer and a protection film in a known manner to complete the SRAM cell (not shown) having TFTs as PMOS load transistors.

In the semiconductor device thus fabricated, PN junctions are formed within the polysilicon pad 15b for connecting the drain region 17a of the TFT to the drive transistors DTr1 and DTr2 and within the polysilicon pad 15c. Therefore, the PN junction area can be significantly increased.

Unlike a PN junction formed in a single-crystalline silicon, numerous grain boundaries are formed at the PN junction interface within the polysilicon pads 15b and 15c. The grain boundaries serve to lower the rectification characteristic of the PN junction, thereby increasing a reverse leak current and weakening a barrier of built-in potential.

Further, electric current can be supplied from the power source through the wiring 20, regions 15cc and 15bb in the polysilicon pads 15c and 15b having the same conductivity type as that of the source/drain regions, and the source region 17c of the TFT, none of which include PN junction. Therefore, the resistance of the power supply section can be reduced.

Accordingly, the current flowing through the PN junctions can be increased proportionally to the increase in the area of the PN junctions, thereby increasing the current supply to the memory cell.

Figure 12:
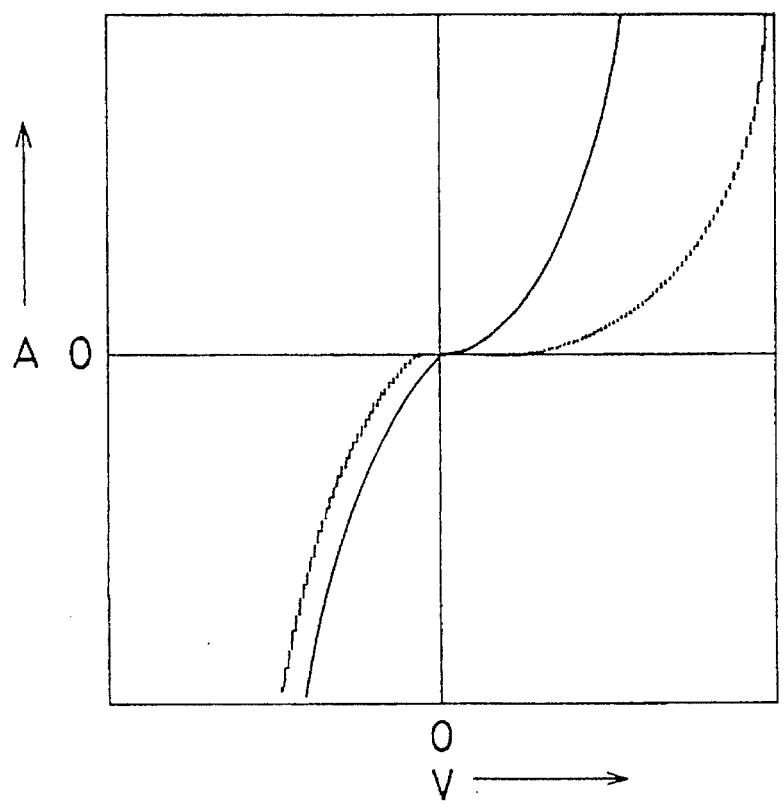
FIG. 12 is a graphical representation showing a current-voltage characteristic observed at a juncture between a wiring and TFT source in a power supply section.

FIG. 12 shows a current-voltage characteristic (illustrated in a solid line) observed at the juncture between the wiring 20 and the source region 17c of the TFT in the power supply section of the present invention. FIG. 12 also shows a current-voltage characteristic (illustrated in a waved line) observed in a power source section of the foregoing conventional SRAM.

Figure 13:
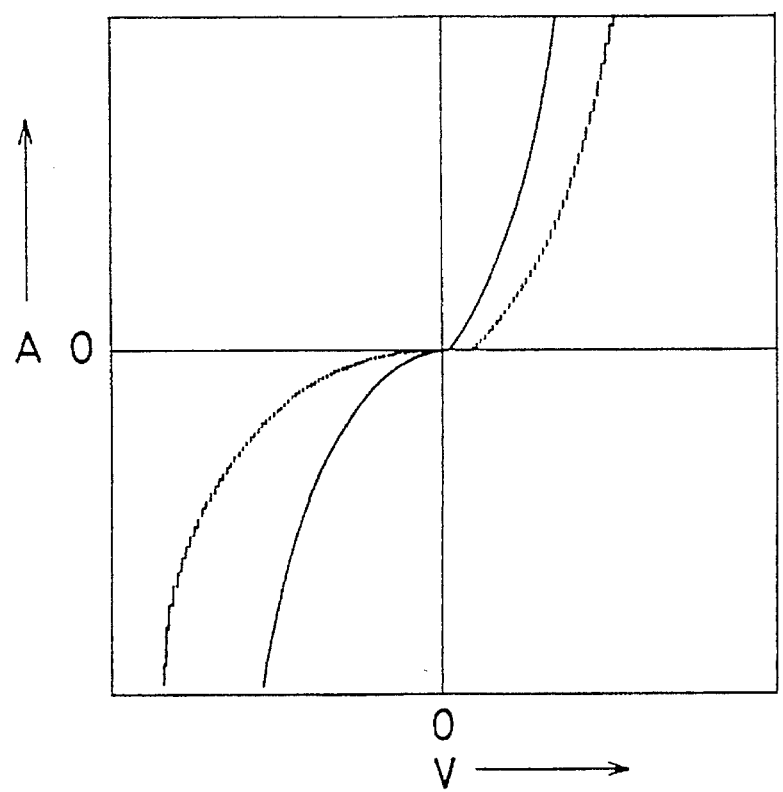
FIG. 13 is a graphical representation showing a current-voltage characteristic observed at a juncture between a TFT drain and a storage node.

FIG. 13 shows a current-voltage characteristic (illustrated in a solid line) observed at the juncture between the drain region 17a of the TFT and a storage node of the present invention. FIG. 13 also shows a current-voltage characteristic (illustrated in a waved line) observed in the power source section of the foregoing convention SRAM.

Example 2

A production process of a semiconductor device according to a second embodiment of the present invention will be described with reference to FIGS. 14 to 16.

A pair of drive MOS transistors, an interlayer insulation film 32, a gate electrode 33 of one drive MOS transistor, a source/drain region 34 of the other drive MOS transistor, a gate electrode 35a of a TFT, polysilicon pads 35b and 35c, a gate oxide film 36, an active layer 37 and a resist pattern 38 are formed on a silicon substrate 30 in accordance with substantially the same process as described in the first embodiment with reference to FIGS. 1 to 5.

Figure 14:
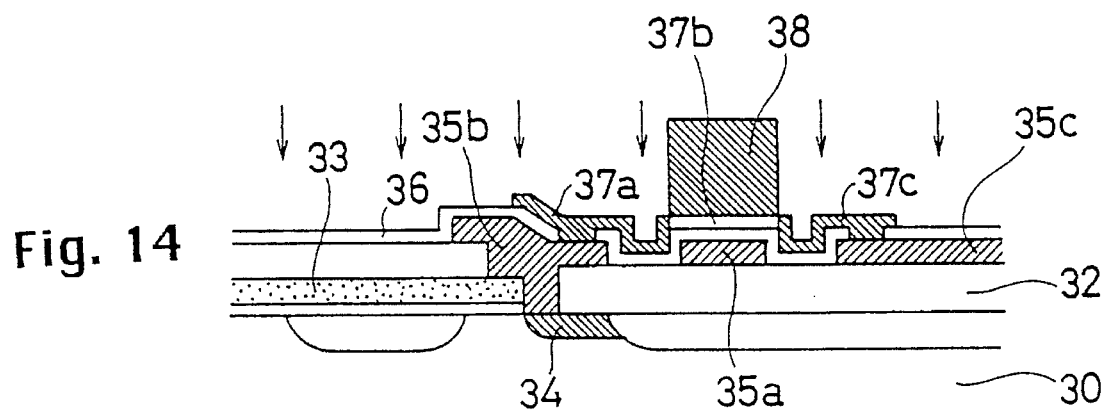
FIGS. 14 to 16 are diagrams illustrating a production process of a semiconductor device according to a second embodiment of the present invention.

Thereafter, the active layer 37 is ion-implanted using the resist pattern 38 as a mask to form source/drain regions 37c and 37a and channel 37b of the TFT in substantially the same manner as described in the first embodiment, as shown in FIG. 14.

Figure 15:
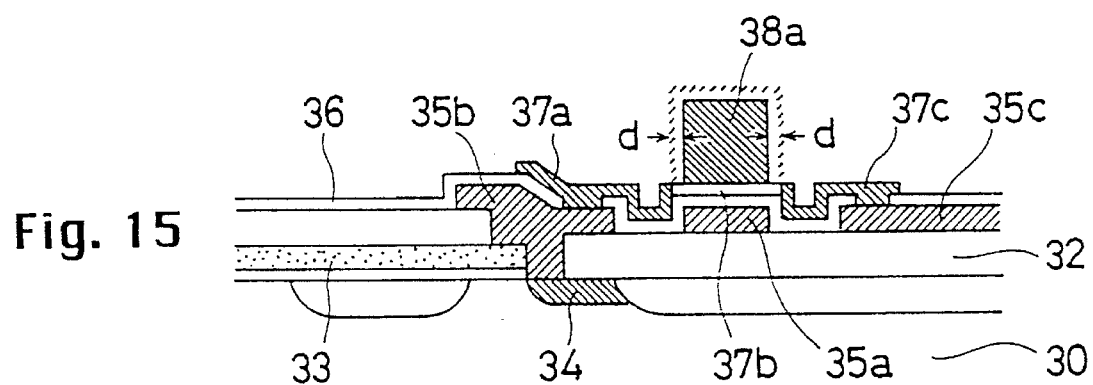

In turn, as shown in FIG. 15, the resist pattern 38 is isotropically etched at edge portions thereof, for example, by a width d of about 1.0 m in an oxygen plasma atmosphere to form a resist pattern 38a so as to uncover a part of the channel 37b.

Figure 16:
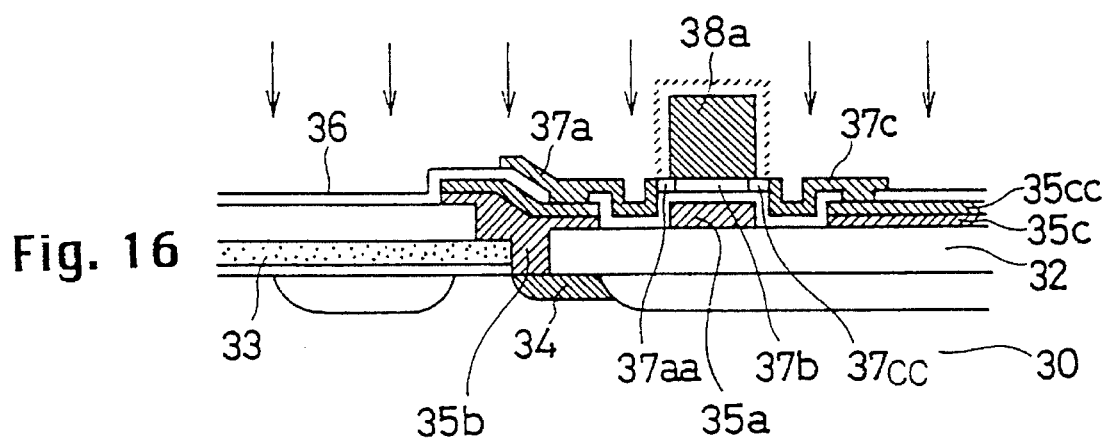

Then, as shown in FIG. 16, P-type ions are implanted into the active layer 37 in a high dose of about $1\times10^{15}$ cm$^{-2}$ to about $3\times10^{15}$ cm$^{-2}$ using the resist pattern 38a as a mask. The implantation energy is high, specifically between about 30 KeV and about 100 KeV for boron ions. Thus, on edge portions of the source/drain regions 37c and 37a adjacent the channel 37b of the TFT are formed LDD regions 37cc and 37aa which have an impurity concentration lower than that of the source/drain regions 37c and 37a. At this time, regions 35cc and 35bb of the same conductivity type as that of the source/drain regions 37c and 37a are also formed in the surface layers of the polysilicon pads 35c and 35b by way of ion-implantation through the source/drain regions 37c and 37a and the gate oxide film 36.

The implanted ions are distributed into the substrate thicknesswise at a unit area density as calculated from the following equation:

$$n(x) = \frac{\phi}{\sqrt{2 \Delta Rp}} \exp - \left( \frac{x - Rp}{\sqrt{2 \Delta Rp}} \right)^2$$

where n(x) is a unit area density of implanted impurity at a depth x, $\phi$ is a dose per unit area, Rp is range pitch of implanted ions, and $\Delta Rp$ is a variance of range pitch of implanted ions.

Part of the ions implanted through the source/drain regions 37c and 37a and the gate oxide film 36 reaches the surface layers of the polysilicon pads 35c and 35b.

Another part of the ions remains in a region uncovered with the resist pattern 38a to form the LDD regions 37cc and 37aa which have a low impurity concentration.

After an interlayer insulation film, metal wiring, and other components are formed in accordance with substantially the same process as described in the first embodiment, an interlayer film, through-holes, a second metal wiring layer and a protection film, if necessary, are formed in a known manner.

Thus, the SRAM cell having TFTs as PMOS transistors (not shown) is completed.

In the semiconductor device thus contact pads 35b and 35c and, therefore, the area of the PN junctions can be significantly increased. Accordingly, the current flowing through the PN junctions can be increased proportionally to the increase in the area of the PN junctions, thereby increasing the current supply to the memory cell.

Further, since the regions which have a low concentration of P-type impurity can be formed on the side of the channel of the TFT in a self-alignment manner by using the resist pattern 38a, the LDD (Lightly Doped Drain) structure can be realized without increasing the steps of the photolithographic process. According to this LDD structure, an electric field generated at a drain edge can be reduced. Therefore, the leak current can be reduced and the deterioration of the TFT characteristic such as caused by hot carrier can be prevented. This will significantly improve the characteristics of the TFT.

Example 3

A production process of a semiconductor device according to a third embodiment of the present invention will be described with reference to FIGS. 17 to 22.

Figure 17:
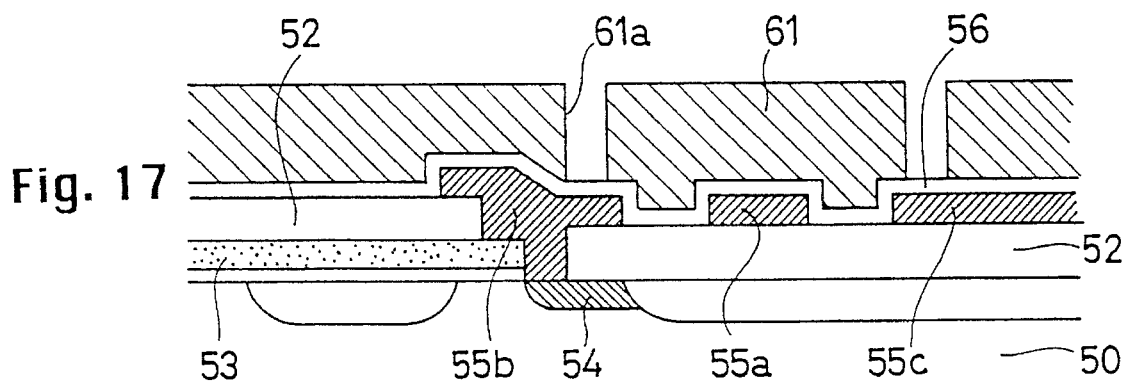
FIGS. 17 to 22 are diagrams illustrating a production process of a semiconductor device according to a third embodiment of the present invention.

A pair of drive MOS transistors, an interlayer insulation film 52, a gate electrode 53 of one drive MOS transistor, a source/drain region 54 of the other drive MOS transistor, a gate electrode 55a of a TFT, polysilicon pads 55b and 55c, a gate oxide film 56 and a resist pattern 61 are formed on a silicon substrate 50 in accordance with substantially the same process as described in the first embodiment with reference to FIGS. 1 to 5. Thereafter, contact holes 61a are formed in desired regions of the resist pattern 61, as shown in FIG. 17. Then, openings (not shown) are formed in the gate oxide film 56 on the polysilicon pads 55b and 55c by etching the gate oxide film 56 by RIE process with use of the resist pattern 61 as an etching mask.

Figure 18:
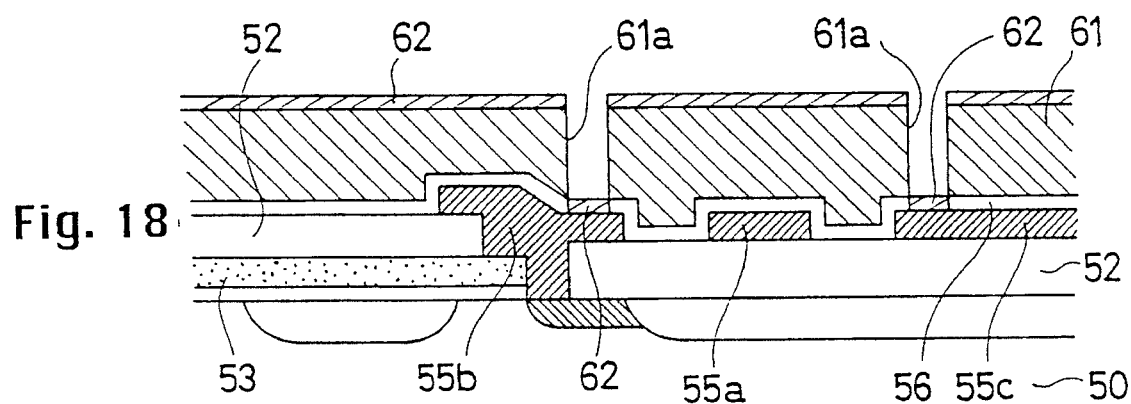

A titanium film 62 such as having a thickness of about 10 nm is formed on the resist pattern 61 including the contact holes 61a through physical vapor phase epitaxy, for example, by way of electron beam evaporation or sputtering, as shown in FIG. 18. The titanium film 62 is formed only on the flat surface of the resist pattern 61 and the bottom faces of the contact holes 61a, not on the inner walls of the contact holes 61a of the resist pattern 61, because this film forming method has a strong directionality.

Figure 19:
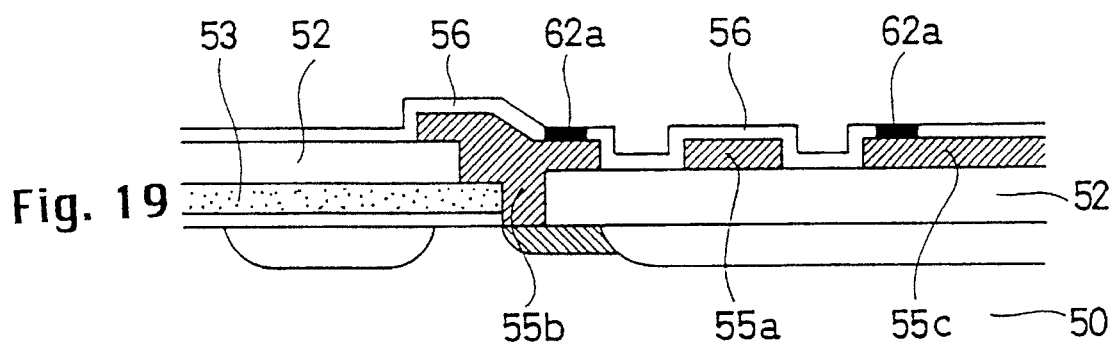

In turn, as shown in FIG. 19, the resist pattern 61 is removed by using an organic solvent such as acetone. At this time, the titanium film 62 formed on the resist pattern 61 is removed along with the resist pattern 61, and only the titanium film formed on the bottom faces of the contact holes 61a remain.

The titanium film 62 on the polysilicon pads 55b and 55c is annealed in a nitrogen atmosphere at a temperature of about 600° C. so as to be turned into a titanium nitride 62a.

Figure 20:
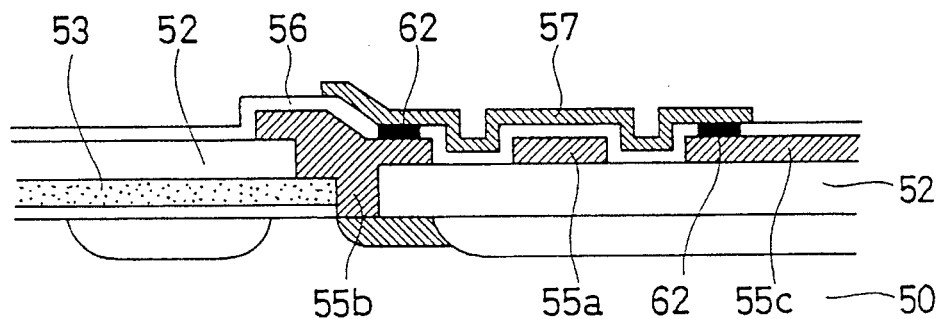

Then, as shown in FIG. 20, a polysilicon film with a thickness of about 10 nm to 100 nm is deposited on the gate oxide film 56 and titanium film 62 by low pressure CVD, and patterned into a desired configuration to form an active layer 57 which is to serve as a channel and source/drain regions of the TFT. The polysilicon pads 55b and 55c are connected to the active layer 57 via the titanium nitride film 62a formed in the openings of the gate oxide film 56. The polysilicon film constituting the active layer 57 may be formed by depositing an amorphous silicon thin film by way of low pressure CVD and then annealing the thin film at a temperature of about 600° C. for re-crystallization, as described in the first embodiment. Further, the polysilicon film may be doped with such an impurity as phosphorus or arsenic in a low dose of about $10^{12}$ $cm^{-2}$ to about $10^{13}$ $cm^{-2}$ through ion-implantation to adjust a threshold voltage of the TFT.

Figure 21:
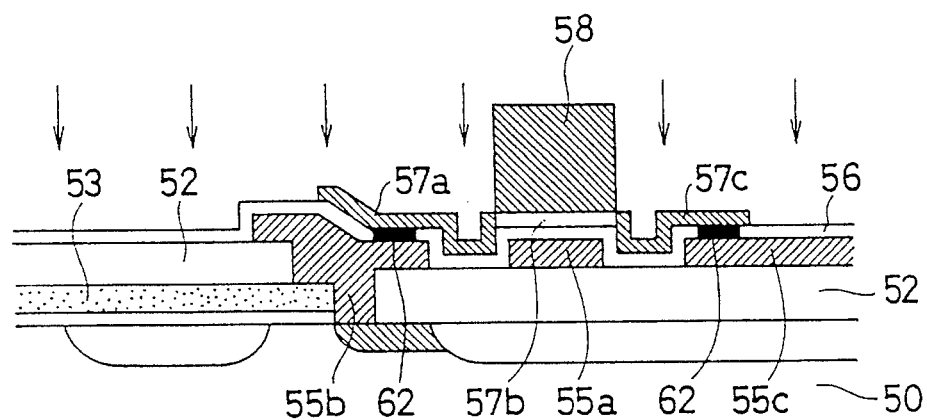

Next, a resist is applied on the entire surface of the silicon substrate 50, and patterned into a desired configuration by photolithography process, as shown in FIG. 21. Using the resist pattern 58 as a mask, boron ions or $BF_2$ ions are implanted into the active layer 57 in a dose of about $10^{14}$ $cm^{-2}$ to about $10^{15}$ $cm^{-2}$ to form the source/drain regions 57c and 57a. At this time, the implantation energy is between about 10 KeV and about 25 KeV for boron, or between about 30 KeV and about 100 KeV for $BF_2$. A portion of the active layer 57 covered with the resist pattern 58 is not doped with the P-type impurity, thus defining the channel 57b of the TFT.

Figure 22:
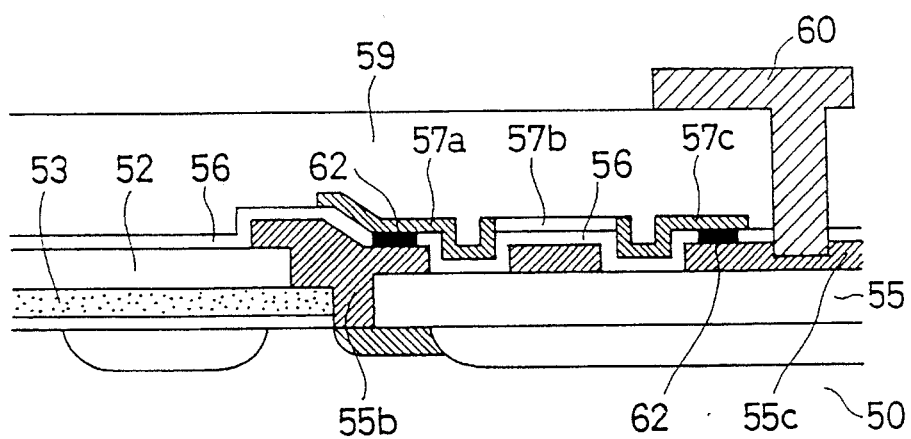

After the resist pattern 58 is removed, a CVD oxide film 59 with a thickness of 600 nm is deposited on the entire surface of the substrate to form an interlayer insulation film, as shown in FIG. 22. Then, an opening is formed in the CVD oxide film 59, followed by the formation of a metal wiring 60 in accordance with the same process as described in the first embodiment.

As required, there are subsequently formed an interlayer film, through-holes, a second metal wiring layer, a protection film and the like are formed in a known manner to complete the SRAM cell having TFTs as PMOS load transistors (not shown).

According to this embodiment, the source/drain regions 57a and 57c doped with the P-type impurity are connected with the polysilicon pads 55b and 55c doped with the N-type impurity at the opening formed in the gate oxide film 56 via an electrically conductive film for preventing impurity diffusion made of titanium nitride film. Accordingly, the source/drain regions 57a and 57c do not directly contact the polysilicon pads 55b and 55c, whereby mutual impurity diffusion can be prevented by the titanium nitride layer. Therefore, the deterioration of rectification characteristic which may be caused by a PN junction can be prevented, because there exists no PN junction between the source/drain regions 57a and 57c and the polysilicon pads 55b and 55c.

Figure 23:
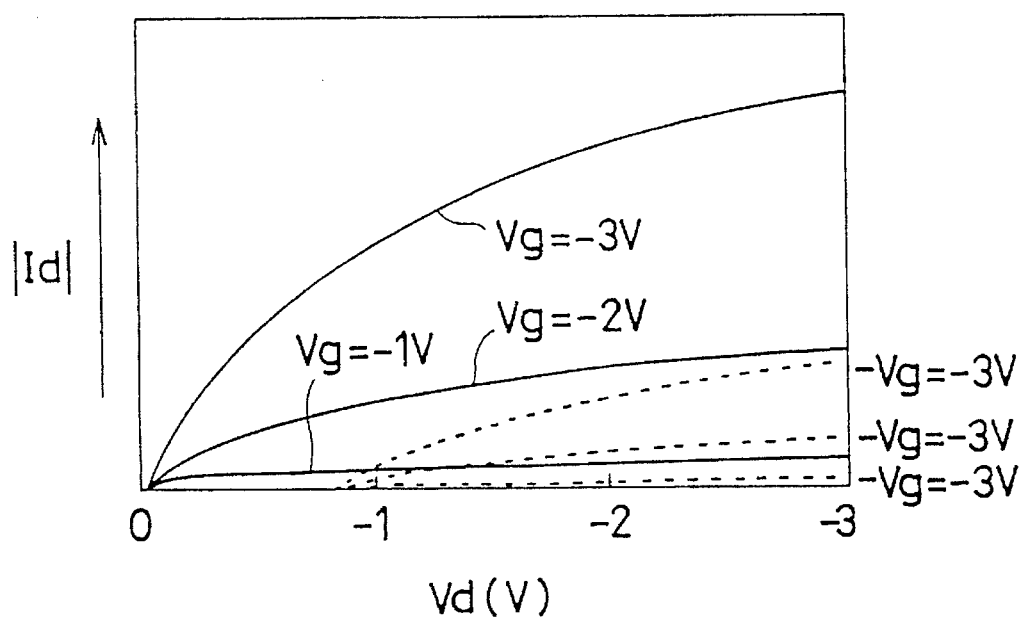
FIG. 23 is a graphical representation showing a relationship between the drain current and the drain voltage.
Figure 24:
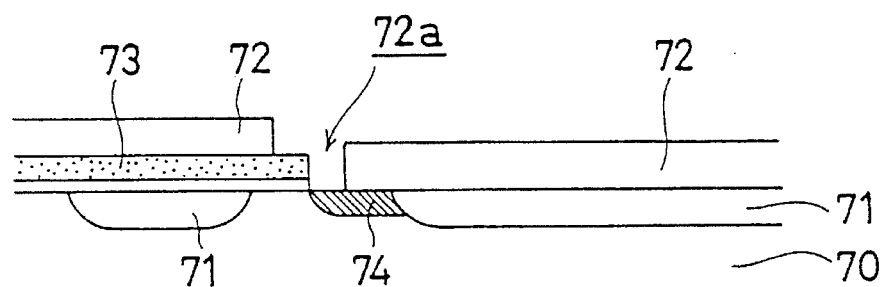
FIGS. 24 to 32 are diagrams illustrating a conventional production process of a semiconductor device.
Figure 25:
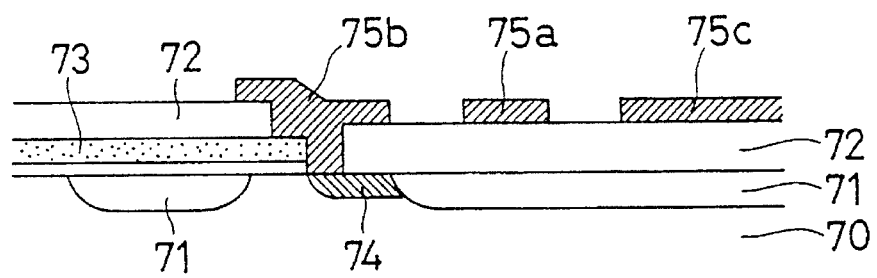
Figure 26:
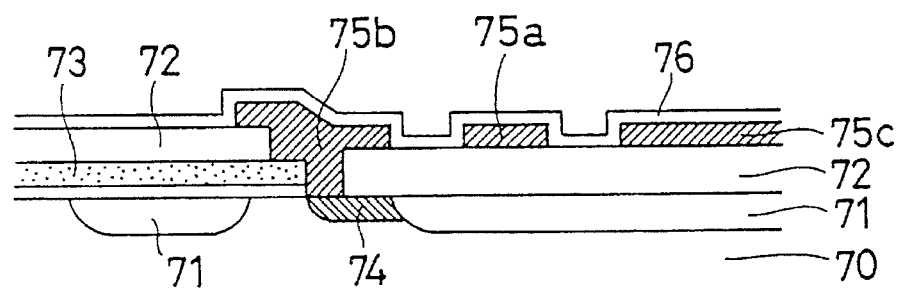
Figure 27:
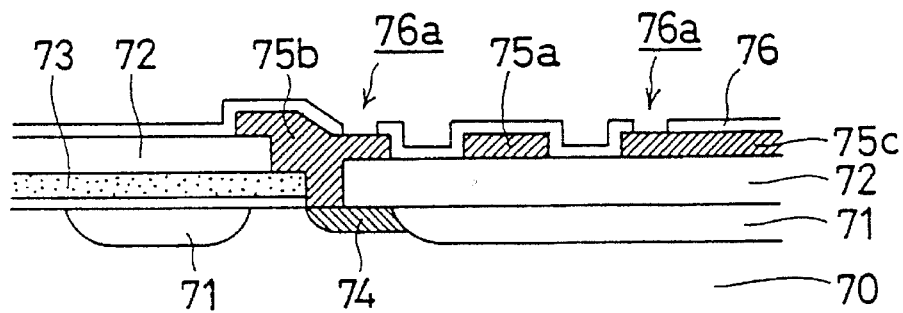
Figure 28:
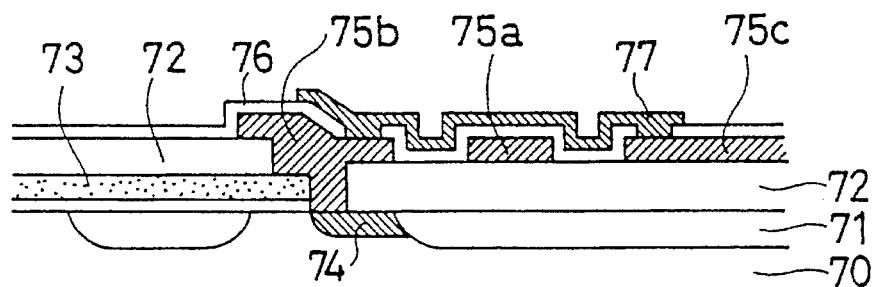
Figure 29:
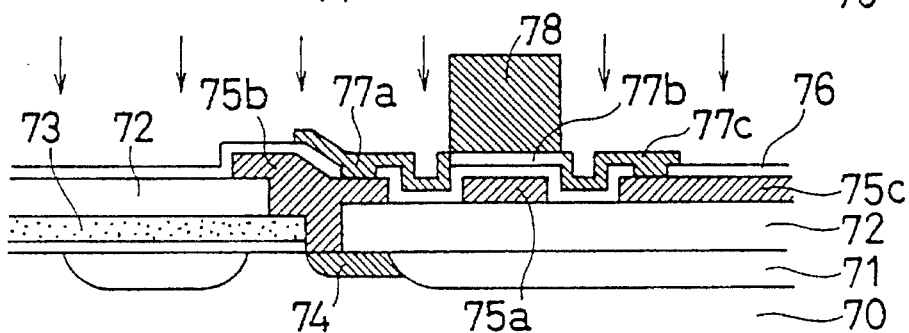
Figure 30:
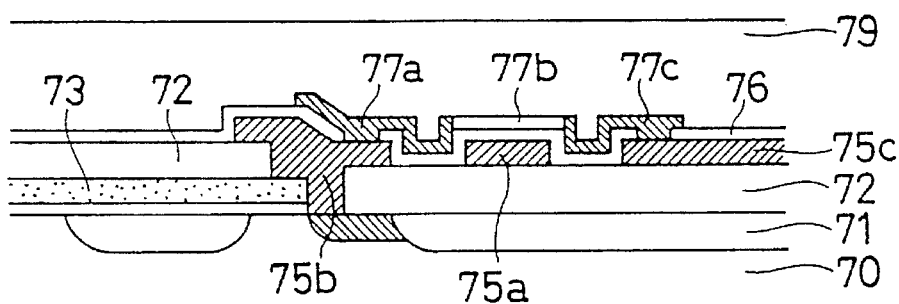
Figure 31:
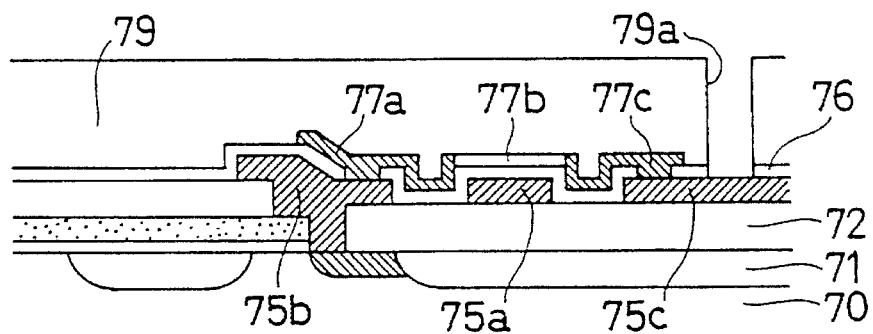
Figure 32:
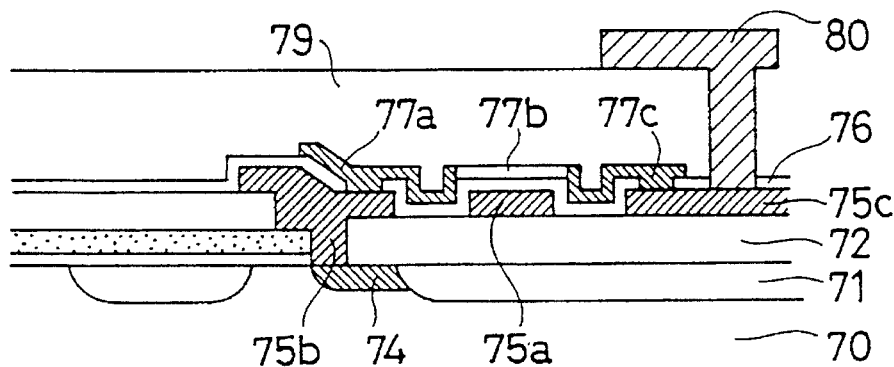

FIG. 23 shows a drain current versus drain voltage characteristic of the aforesaid TFT (illustrated in a solid line). FIG. 23 also shows a drain current versus drain voltage characteristic of the conventional TFT (illustrated in a dotted line). As can be clearly understood therefrom, the drain current of the TFT of the present invention is about three times that of the conventional TFT. This is because the source region 57c and polysilicon pad 55c are connected via the titanium nitride film 62 in this embodiment and, therefore, the parasitic deterioration of the rectification characteristic caused in a reverse PN junction between the source region and polysilicon pad can be eliminated.

In the conventional TFT, the drain current does not flow with a relatively low voltage such as |Vd|<0.8 V. This is because the drain current is not obtained unless the drain voltage is greater than a parasitic built-in potential generated at a forward PN junction between the drain region and polysilicon pad. In the TFT of the present invention, on the their hand, the drain current was observed with a relatively low voltage. This is conceivably because the generation of the parasitic diode at the PN junction can be avoided and, therefore, the drain current can be observed with a relatively low drain voltage.

Accordingly, an excellent ohmic contact can be realized by respectively connecting the source region 57c to the polysilicon pad 55c, and the drain region 57a to the polysilicon pad 55b via the titanium nitride film. Hence, the drive current of the TFT and the current supply from the TFT to the storage node can be increased to improve the data retention characteristic of the memory cell.

As can be seen from the foregoing, in the semiconductor device according to the present invention, the source/drain regions of the TFT are connected to the wiring and the drive transistor via the semiconductor pads, and at least the surface layers of the semiconductor pads have the same conductivity type as that of the source/drain regions of the TFT. Accordingly, the PN junctions which are conventionally defined between the source/drain regions and the corresponding semiconductor pads are formed within the semiconductor pads. Therefore, the area of the PN junctions can be increased to ensure the stable power supply to the memory cell. Further, a barrier of built-in potential generated at a forward PN junction in the juncture of the drain region of the TFT and the storage node can be eliminated. Therefore, the supply current to the storage node and the stored potential can be increased. This will result in a faster data writing speed and an excellent data retention characteristic, thereby improving the performance and yield of semiconductor devices.

Further, where the source/drain regions of the TFT have an LDD structure in the aforesaid semiconductor device, the electric field generated at the drain edge when voltage is applied can be diminished. Accordingly, the leak current can be reduced, and the deterioration of the TFT characteristic such as caused by hot carrier can be prevented.

Still further, the source/drain regions of the TFT are connected to the wiring and the drive transistor via the semiconductor pads, and the direct contact between the source/drain regions of one conductivity type and the semiconductor pads of the other conductivity type is prevented by interposing therebetween an electrically conductive film for preventing impurity diffusion. Therefore, the mutual impurity diffusion between the source/drain regions and the semiconductor pads can be prevented. Furthermore, because the source region does not directly contact the corresponding semiconductor pad, the formation of a reverse PN junction can be avoided, thereby realizing a stable power supply to the memory cell. In addition, because the drain region does not directly contact the corresponding semiconductor pad, a barrier of built-in potential generated at a forward PN junction can be eliminated.

Accordingly, the current supply to the storage node and the stored potential can be increased and, therefore, the speed of writing data into the memory cell and the data retention characteristic can be improved.

In accordance with the production method of the semiconductor device of the present invention, the mask used for the formation of the source/drain regions of the TFT is reused to form regions of the same conductivity type as that of the source/drain regions of the TFT at least in the surface layers of the semiconductor pads for connection the source/drain regions of the TFT to the wiring and the drive transistor. Accordingly, the deterioration of the TFT characteristic which may be caused by a reverse PN junction between a source/drain region of the TFT and the corresponding semiconductor pad can be readily avoided without increasing the steps of the production process. Therefore, semiconductor devices with improved performance can be produced at a high yield.

Further, where the electrically conductive films for impurity diffusion prevention are formed on the respective semiconductor pads which connect the source/drain regions of the TFT to the wiring and drive transistor, the resist mask used for the formation of the openings in the gate oxide film is reused. Accordingly, the LDD structure can be realized in a self-alignment manner without additional photolithographic process. Therefore, semiconductor device with improved performance can be readily produced at a high yield without complicating the production process.

What is claimed is:

1. A semiconductor device which comprises plural memory cells, said memory cell comprising:

a flip-flop circuit including a pair of drive transistors each having a gate electrode, a gate oxide film and source/drain regions, and a pair of load TFTs connected to said pair of drive transistors, each of said load TFTs having a gate electrode, a gate oxide film and an active layer including source/drain regions all of which are deposited sequentially in that order; and a pair of access transistors connected to said flip-flop circuit;

wherein either one of the source/drain regions of said each TFT is connected via a semiconductor pad to at least either one drive transistor at either one of the source/drain regions thereof or the other drive transistor at the gate electrode thereof, and the other of the source/drain regions of the TFT is connected to a wiring layer via a semiconductor pad; and at least surface layer of said semiconductor pad has the same conductivity type as that of the source/drain regions of the TFT.

2. A semiconductor device as set forth in claim 1, wherein the source/drain regions of the TFT have an LDD structure.

3. A semiconductor device which comprises plural memory cells, said memory cell comprising:

a flip-flop circuit including a pair of drive transistors each having a gate electrode, a gate oxide film and source/drain regions, and a pair of load TFTs connected to said pair of drive transistors, each of said load TFTs having a gate electrode, a gate oxide film and an active layer including source/drain regions all of which are deposited sequentially in that order; and a pair of access transistors connected to said flip-flop circuit;

wherein either one of the source/drain regions of said each TFT is connected via an electrically conductive film for preventing impurity diffusion to a semiconductor pad and to at least either one drive transistor at either one of the source/drain regions thereof or the other drive transistor at the gate thereof, and the other of the source/drain regions of the TFT is connected to a wiring layer via an electrically conductive film for preventing impurity diffusion to a semiconductor pad.

4. A semiconductor device as set forth in claim 3, wherein said electrically conductive film for preventing impurity diffusion is made of titanium nitride.

5. A semiconductor device as set forth in claim 3, wherein said source/drain regions of the TFT have an LDD structure.

* * * * *